United States Patent
Lee (12)

(10) Patent No.: US 6,174,596 B1
(45) Date of Patent: Jan. 16, 2001

(54) PROCESS FOR FABRICATING DUAL DAMASCENE STRUCTURE BY APPLYING AN ETCH-DIFFERENTIATING TECHNIQUE ON A LIGHT SENSITIVE ORGANIC OXIDE LAYER

(75) Inventor: Chen-tsai Lee, Taipei (TW)

(73) Assignee: Winbond Electronics Corp., Hsinchu (TW)

( * ) Notice: Under 35 U.S.C. 154(b), the term of this patent shall be extended for 0 days.

(21) Appl. No.: 08/800,159

(22) Filed: Feb. 13, 1997

(51) Int. Cl.$^7$ .............................. B32B 3/26; H01L 21/302
(52) U.S. Cl. ..................................... 428/304.4; 428/318.4; 438/704; 438/745
(58) Field of Search ............................. 428/304.4, 318.4; 438/704, 745

(56) References Cited

U.S. PATENT DOCUMENTS 5,578,523 * 11/1996 Fiordalice et al. .

FOREIGN PATENT DOCUMENTS

| 7-325383 | * 12/1995 | (JP) | G03F/1/08 |
| 8-124926 | * 5/1996 | (JP) | H01L/21/3205 |
| 8-203876 | * 8/1996 | (JP) | H01L/21/3065 |

* cited by examiner

Primary Examiner—Mark Chapman
(74) Attorney, Agent, or Firm—Bo-In Lin

(57) ABSTRACT

This invention discloses a dual damascene structure supported on a semiconductor substrate. The dual damascene structure includes an etch-differentiating layer disposed above a top surface of the substrate. The dual damascene structure further includes a trench disposed on a top portion in the etch-differentiating layer. The dual damascene structure further includes an etched via disposed in the trench penetrating the etch differentiating layer therethrough above a non-etch-damaged portion of the top surface of the substrate.

4 Claims, 2 Drawing Sheets

PROCESS FOR FABRICATING DUAL DAMASCENE STRUCTURE BY APPLYING AN ETCH-DIFFERENTIATING TECHNIQUE ON A LIGHT SENSITIVE ORGANIC OXIDE LAYER

BACKGROUND OF THE INVENTION

1. Field of the Invention

This invention relates generally to the manufacture method for semiconductor chips and integrated circuits (ICs). More particularly, this invention relates to a novel and improved method of manufacture by applying a differentiating etching technique on a layer of the semiconductor chip to produce an improved dual damascene structure such that the reliability and performance characteristics of IC devices can be improved by eliminating surface damages caused by deep dry etch and by more precisely control the critical dimensions (CDs) of the interconnect lines and contact plugs.

2. Description of the Prior Art

Several technical difficulties are still faced by those of ordinary skill in the art of the semiconductor manufacture industry in applying a dual damascene process, commonly implemented for deep-sub-micron devices, to form the trenches and the vias in the trenches for interconnect lines and contact plugs to be filled therein respectively. The difficulties are caused by the application of a twice-dry-etch process, which in a second etch process, etching through a dielectric or an oxide layer to make the via for contact plugs. The etched via reaches the top surface of the substrate. This second dry etch process often leads to surface damages to the substrate thus resulting in gate-oxide degradation. Furthermore, due to the nature of the dry etch process, the critical dimensions (CDs) of the vias, formed in the trench for contact plugs, etched by the second etch process, tend to have dimensional variations which are generally more unpredictable and uncontrollable. The greater imprecision of the critical dimensions incurred in the second etch is caused by certain topographical profiles resulted from the first dry etch. Therefore, the reliability and performance characteristics of the devices manufactured by the deep sub-micron technology, applying this conventional dual damascene process, are often adversely affected by these difficulties.

In order to provide a more comprehensive background to better understand the merits of this invention, the fabrication processes commonly employed for a dual damascene structure are illustrated in FIGS. 1A to 1D. Referring to FIG. 1A where an oxide layer 15 is supported on a substrate 10. A plurality of trenches 20 are first formed on the top surface of the oxide layer 15 for the purpose of forming the interconnect lines therein (see FIG. 1D below). Only the top portion of the oxide layer 15 is removed in forming the trenches 20 for the interconnect lines. The first dry etch process does not completely penetrate through the oxide layer 20. Referring to FIG. 1B, a photo-resist (not shown) is employed by applying photolithography technique to define the through hole areas. A second dry etch process is then carried out to form the contact plugs through holes 25 in the trenches 20. As shown in FIG. 1B, the through holes 25 penetrate through the oxide layer 20 and reach the top surface of the substrate 10. A metallization process is then carried out in FIG. 1C to form a top metal layer 30. A planarization process is performed by carrying out a chemical mechanical polishing process (CMP) as shown in FIG. 1D to polish and remove the top portion of the metal layer 30 to form the interconnect lines 35 in the trenches 20 and the contact plugs 40 in the through holes 25. A dual damascene structure is completed as that shown in FIG. 1D.

During the second dry etch process, the top surface of the substrate 10 is exposed to the etching plasma. As the etch plasma ions continuously penetrate the oxide layer 15, it is very difficult to control the timing and conditions of the etching plasma during the second dry etch process to assure that the top surface of the substrate 10 will not be over etched or damaged by the etching plasma. Uncontrollable exposure of the top surface of the substrate 10 to the etching plasma during the second etch process in forming the through holes 25 for the contact plugs 40 thus imposes a threat to the quality of the top surface of the substrate 10 and the integrity of the gate oxide layer formed thereon. Problems of device reliability and performance uncertainties may then be resulted from such threats caused by the plasma attacks to the substrate surface.

Additional technical difficulties are caused by the imprecision in controlling the critical dimensions of the through holes 20 formed by the second etch process. As the trenched are formed by a first dry etch process, certain trench profiles are formed at the completion of the first dry etch. The trench profiles resulting from the first dry etch produce certain unknown and uncontrollable dimensional variations. Greater variations in the critical dimensions of the through holes 25 are introduced when applying a second etch to the trenches formed by the first dry etch. The uncertainties in dimensional variations of the through holes 25 formed by the second etch are accumulated and compounded from the variations of the first dry etch and the second etch. Thus, further difficulties in controlling the device reliability and performance characteristics are introduced due to these greater variations in the locations and dimensions of the contact plugs.

Therefore, a need still exists in the art of semiconductor chip and integrated circuit (IC) manufacture to provide a novel manufacture process to resolve the above difficulties. It is desirable that the novel manufacture process to form the dual damascene structure which is simple and easy to implement whereby a lower cost of manufacture can be achieved. Additionally, it is desirable that this novel manufacture process for forming the dual damascene structure provides more control precision in forming the small through holes and trenches for contact plugs and interconnect lines such that semiconductor devices of improved reliability and well controlled performance characteristics can be reliably produced.

SUMMARY OF THE PRESENT INVENTION

It is therefore an object of the present invention to provide a novel and improved manufacture process for forming the dual damascene structure by first applying an etching-rate differentiating technique and a non-damaging etch-through process to an over-layer above the top surface of the semiconductor substrate such that the difficulties and limitations encountered in the prior art can be overcome.

Specifically, it is an object of the present invention to provide a novel and improved manufacture process for performing the task of forming the dual damascene structure by first forming an over-layer with light sensitive materials and applying a non-damaging wet etch to etch through the over-layer through areas first exposed with etch-enhancing light on the over layer thus the damaging effects to the substrate surface may be prevented.

Another object of the present invention is to provide a novel and improved manufacture process for performing the task of forming the dual damascene structure by first forming an over-layer with light sensitive materials and applying a non-damaging wet etch to etch through the over-layer through areas first exposed with etch-enhancing light on the over layer thus whereby the critical dimensions of the through holes provided for contact plugs can be more precisely controlled.

Another object of the present invention is to provide a novel and improved manufacture process for performing the task of forming the dual damascene structure by first forming an over-layer with light sensitive materials and applying a non-damaging wet etch to etch through the over-layer through areas first exposed with etch-enhancing light on the over layer followed by a dry etch to form the trenches for the interconnect lines above the through holes whereby the critical dimensions of both the through holes and the trenches can be more precisely controlled.

Another object of the present invention is to provide a novel and improved manufacture process for performing the task of forming the dual damascene structure by first forming an over-layer with light sensitive materials and applying a non-damaging anisotropic wet etch to etch through the over-layer through areas first exposed with etch-enhancing light on the over layer followed by a dry etch to form the trenches for the interconnect lines above the through holes whereby an improved damascene structure can be formed by a simple process flow and low production cost can be maintained.

Briefly, in a preferred embodiment, the present invention discloses a dual damascene structure supported on a semiconductor substrate. The dual damascene structure includes an etch-differentiating layer disposed above a top surface of the substrate. The dual damascene structure further includes a trench disposed on a top portion in the etch-differentiating layer. The dual damascene structure further includes an etched via disposed in the trench penetrating the etch differentiating layer therethrough above a non-etch-damaged portion of the top surface of the substrate.

This invention further discloses a method of manufacturing a dual damascene structure supported on a semiconductor substrate. The method includes the steps of (a) forming an etch-differentiating layer on the substrate by employing a light sensitive organic oxide; (b) forming an etch-enhanced zone in the etch-differentiating-layer by applying a photolithography process to pattern the etch enhanced zone wherein the etch-enhanced zone having a higher etch rate than remaining regions in the etch differentiating layer; (c) etching a trench covering a portion of the etch enhanced zone therein; and (d) applying a non-damaging anisotropic wet etch process to etch and penetrate through the etch differentiating layer through the etch-differentiating zone whereby a the damascene structure is formed with an etched via formed through the enhance etch zone in the trench.

In another preferred embodiment, the invention further discloses a method of forming an etched via in an over-layer above a substrate of a semiconductor chip. The method includes the steps of (a) forming an etch-differentiating zone in the over-layer wherein the etch-differentiating zone having a higher etch rate than the over layer; and (b) etching the etch-differentiating zone in the over layer to form the etched via therein. In a preferred embodiment, the step of forming an etch-differentiating zone in the over-layer including a step of employing a light sensitive material in forming the layer and applying a patterned light exposure process to form the etch differentiating zone in the over layer composed of the light sensitive material. In another preferred embodiment, the step of etching the etch-differentiating zone in the over layer including a step of applying a wet etch to etch the etch differentiating zone. In yet another preferred embodiment, the step of employing a light sensitive material in forming the over layer including a step of employing an light sensitive organic oxide in forming the over layer. In yet another preferred embodiment, the step of applying a patterned light exposure process including a step of applying a photolithography process to pattern the etch differentiating zone in the over layer.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
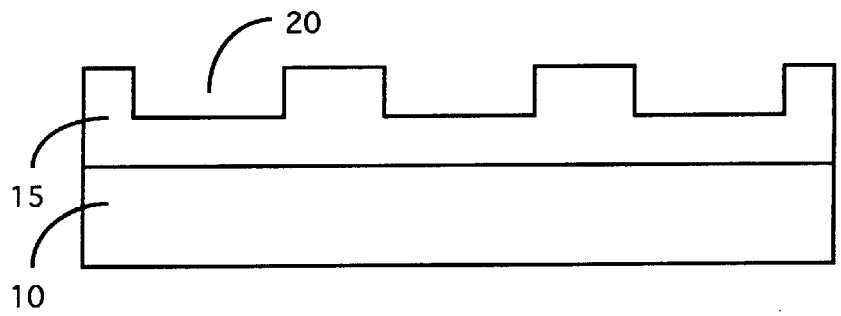
FIGS. 1A to 1D are cross sectional view for illustrating the processing steps implemented in a prior art manufacture method for forming a dual damascene structure on a semiconductor chip.
Figure 1B:
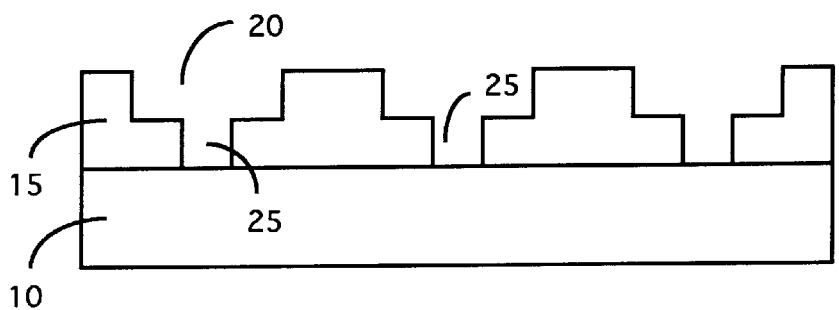
Figure 1C:
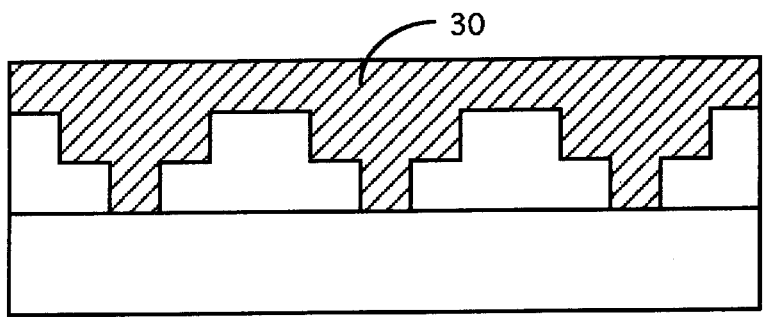
Figure 1D:
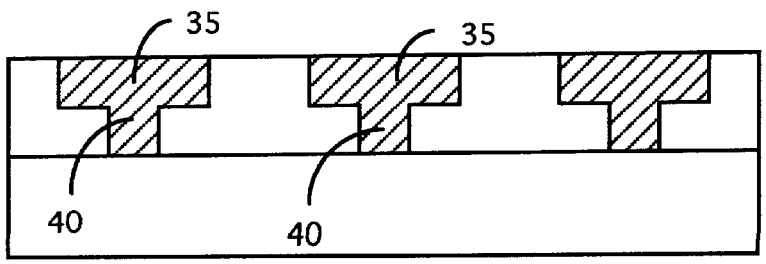

Referring to FIGS. 2A to 2E for a series of cross section views to illustrate the processing steps to form a damascene structure on the surface of semiconductor chip 100 according a novel and improved method of the present invention. The semiconductor chip 100 is supported on a substrate 105. An etching rate differentiating layer such as an organic layer 110 is first deposited on top of the substrate 105 above the top surface 111 of the substrate 105. This etching rate differentiating layer 110 may be an organic spin-on-glass (SOG) layer composed of material made with Allied Signal's 214, 314 and GR720. The material of the etching rate differentiating layer 110, e.g., an organic SOG, is sensitive to the ultraviolet light. The zones which are exposed to ultraviolet light have special enhanced etching rate which is higher than the zones which are not exposed to the ultra-violet lights. A photo-resist layer 115 is then applied on top of the etching rate differentiating layer 110. The photo-resist layer 115 is patterned, by the use of photolithography technology, to have a plurality of openings 120 provided for opening a plurality of through holes therein. The exposed zones underneath the openings 120 of the photo resist layer 115 is then exposed to the ultraviolet light to form a plurality of etch enhanced zone 125 (these etch enhanced zones are shaded to show that the zones have special etch enhanced characteristic).

Figure 2A:
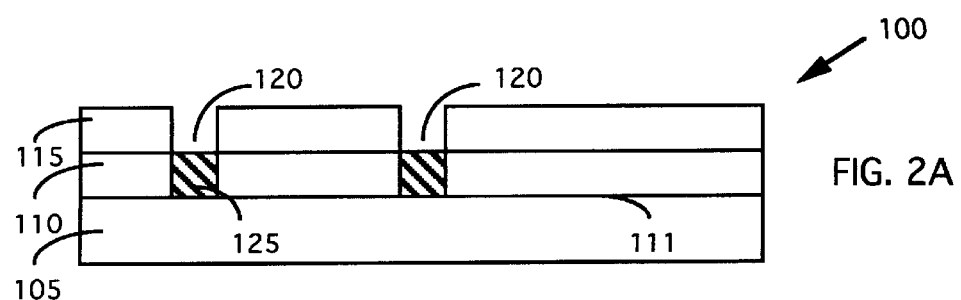
FIGS. 2A to 2E are a series of cross section view of a semiconductor chip for illustrating the processing steps of a novel process for forming a dual damascene structure on a semiconductor chip according to the present invention.
Figure 2B:
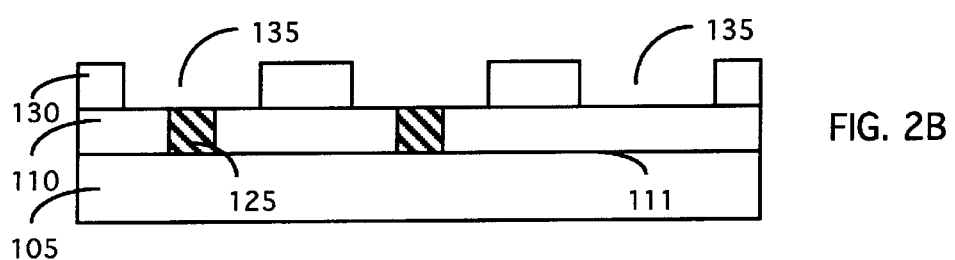

Referring to FIG. 2B, The photo-resist 115 for forming the etch enhanced zones 125 is stripped and a second layer of dry etch photo resist 130 is formed and patterned, again by the use of photolithography technology, to define a plurality of trench openings 135. The technology and process in applying masks and the photolithography technique in defining the photo resist patterns and openings 120 and 135 are standard process and well known in the art of IC manufacture. Details of these steps are not described for the benefits of simplicity and clarity in describing and focusing on the essential features of this invention.

Figure 2C:
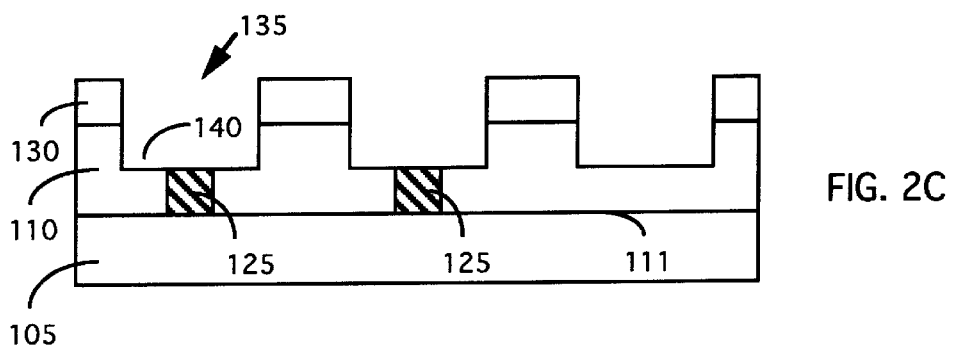

Referring to FIG. 2C, a dry etch is performed by employing the photo resist 130 with trench openings 135. A plurality of trenches 140 are formed by partially etching through the etching differentiating layer 110 removing on a top portion therefrom. It is to be noted that the etching plasma employed in the dry etch process is not allowed to contact the top surface 111 of the substrate 105. A portion of the etch enhance zone 125 is still remained in place protecting the substrate 105 from the etching plasma employed in the dry etch process.

Figure 2D:
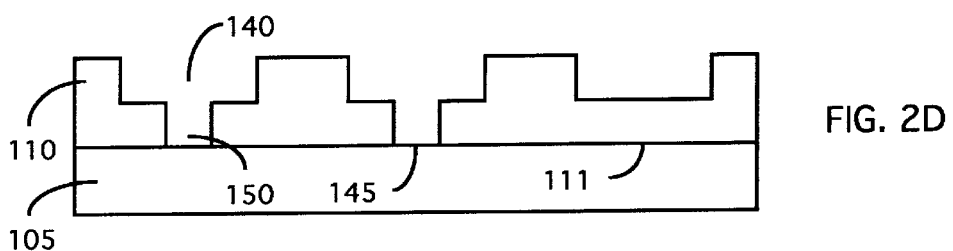

Referring to FIG. 2D, the trench photo resist layer 130 is first removed. An anisotropic wet etch is carried out by applying the liquid etchant such as HF solution to the semiconductor chip 100. A standard procedure may be carried out by submerging the semiconductor chip 100 in a HF solution. The etch enhanced zones 125, composed of the organic oxide material exposed to ultraviolet light, have a higher etching rate. A plurality of through holes 150 penetrating the etch differentiating layer 110 are formed. The etching solutions are selected such that they are non-damaging etchants to the substrate surface. The through holes 150 are thus formed for forming a plurality of contact plugs therein without causing damage to a portion 145 on the top surface 111 of the substrate 105. Furthermore, the etch enhanced zones are prepared with precisely controllable photolithography process. The critical dimension of the via 150 in each trench 140 is well defined and well controlled. The difficulties caused by the uncertainties in critical dimensions of contact plugs formed by the secondary dry etch process is therefore resolved.

Figure 2E:
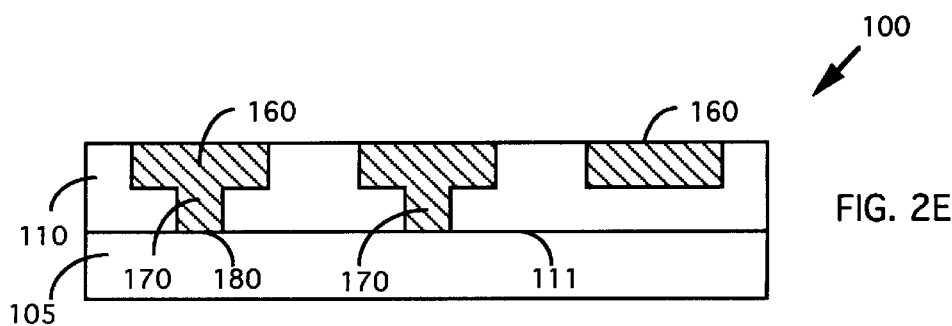

Referring to FIG. 2E, the metallization process and a planarization process applying a CMP technique are then carried out. The interconnect lines 160 and the contact plugs 170 are formed in the trenches 140 and the through holes 150 respectively. A novel process is employed to manufacture the dual damascene structure in the semiconductor chip 100 is completed as shown from FIGS. 2A to 2E. In a preferred process, the organic oxide layer 110 formed as an etch differentiating layer has a thickness ranging from 0.5 to 2 microns. The ultraviolet exposure of this etch differentiating layer 110 is carried out for 15 minutes with ultraviolet light produced by an ultraviolet baking machine made by Fusion Company commonly used for photo-resist hardening process to carry out the Ultraviolet exposure process. The ultraviolet exposure can be carried out at a temperature ranging from 90° C. to 150° C. for a time duration of one to three minutes, exposure for the etch enhanced zones 125 is increased more than three times over the etching rate of the unexposed areas.

In summary, the present invention discloses a dual damascene structure 100 supported on a semiconductor substrate 105. The dual damascene structure 100 includes an etch-differentiating layer 110 disposed above a top surface of the substrate. The dual damascene structure 100 further includes a trench 140 disposed on a top portion in the etch-differentiating layer 110. The dual damascene structure 100 further includes an etched via 150 disposed in the trench 140 penetrating the etch differentiating layer 110 therethrough above a non-etch-damaged portion 145 of the top surface 111 of the substrate 110.

This invention further discloses a method of manufacturing a dual damascene structure 100 supported on a semiconductor substrate 105. The method includes the steps of (a) forming an etch-differentiating layer 110 on the substrate 105 by employing a light sensitive organic oxide; (b) forming an etch-enhanced zone 125 in the etch-differentiating-layer 110 by applying a photolithography process to pattern the etch enhanced zone 125 wherein the etch-enhanced zone 125 having a higher etch rate than remaining regions in the etch differentiating layer 110; (c) etching a trench 140 covering a portion of the etch enhanced zone 125 therein; and (d) applying a non-damaging wet etch process to etch and penetrate through the etch differentiating layer through the etch-differentiating zone whereby a the damascene structure is formed with an etched via 150 formed through the enhanced etch zone 125 in the trench 140.

Therefore, a novel and non-obvious manufacture process for manufacturing a dual damascene structure is disclosed in this invention. This process is applied by employing an etching-rate differentiating technique and a non-damaging etch-through process to an etch differentiating over-layer above the top surface of a semiconductor substrate such that the difficulties and limitations encountered in the prior art can be overcome. Specifically, an over-layer with light sensitive materials is formed and a non-damaging wet etch process is carried out to etch through the over-layer through areas first exposed with etch-enhancing light on the over layer thus the damaging effects to the substrate surface may be prevented. By applying this novel manufacture method, the critical dimensions of the through holes provided for contact plugs in the trench can be more precisely controlled. By first applying a non-damaging wet etch to etch through the over-layer through areas first exposed with etch-enhancing light on the over layer to form the through holes then followed by a dry etch to form the trenches for the interconnect lines above the through holes, the critical dimensions of both the through holes and the trenches can be more precisely controlled. By using the novel method of this invention, an improved damascene structure can be formed by a simple process flow and low production cost can be maintained.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A semiconductor substrate having a top surface provided for manufacturing a dual damascene structure thereon comprising:

an etch-differentiating layer composed of a light sensitive organic oxide having an etch-enhanced column composed of an etch-enhanced light-exposed organic material disposed immediately above said top surface of said substrate wherein said etch-enhanced column having a higher etching rate than a surrounding volume of said etch-differentiating layer;

a trench opened from a top portion in said etch-differentiating layer defining a greater open area than said etch-enhanced column for exposing a top surface of said etch-enhanced column.

2. The semiconductor substrate of claim 1 wherein:

said etch-differentiating layer composed of an ultraviolet sensitive organic oxide; and said etch-enhanced column composed of an ultraviolet-exposed organic oxide.

3. A semiconductor substrate having a top surface provided for manufacturing a dual damascene structure thereon comprising:

an etch-differentiating layer having an etch-enhanced column composed of an etch-enhanced light-exposed organic material disposed immediately above said top surface of said substrate wherein said etch-enhanced column having a higher etching rate than a surrounding volume of said etch-differentiating layer;

a trench opened from a top portion in said etch-differentiating layer defining a greater open area than said etch-enhanced column for exposing a top surface of said etch-enhanced column.

4. A semiconductor substrate provided for making a dual damascene structure thereon comprising:

an etch-differentiating layer having an etch-enhanced column composed of an etch-enhanced material disposed immediately above a top surface of said substrate wherein said etch-enhanced column having a higher etching rate than a surrounding volume of said etch-differentiating layer;

a trench opened from a top portion in said etch-differentiating layer defining a greater open area than said etch-enhanced column for exposing a top surface of said etch-enhanced column.

* * * * *